US005126287A

United States Patent [19]

Jones

[11] Patent Number: 5,126,287

[45] Date of Patent: Jun. 30, 1992

[54] SELF-ALIGNED ELECTRON EMITTER FABRICATION METHOD AND DEVICES FORMED THEREBY

[75] Inventor: Gary W. Jones, Durham, N.C.

[73] Assignee: MCNC, Research Triangle Park, N.C.

[21] Appl. No.: 534,711

[22] Filed: Jun. 7, 1990

[51] Int. Cl.[5] .......... H01L 21/465

[52] U.S. Cl. .......... 437/228; 156/643; 445/50

[58] Field of Search .......... 437/225, 228, 203; 156/643; 445/49, 50, 51

[56] References Cited

U.S. PATENT DOCUMENTS

| | | | |
|---|---|---|---|
| 3,753,022 | 8/1973 | Fraser, Jr. | 313/78 |
| 3,755,704 | 8/1973 | Spindt et al. | 313/309 |
| 3,789,471 | 2/1974 | Spindt et al. | 29/25.17 |
| 3,921,022 | 11/1975 | Levine | 313/309 |
| 3,935,500 | 1/1976 | Oess et al. | 313/495 |
| 3,982,147 | 9/1976 | Redman | 313/309 |
| 3,998,678 | 12/1976 | Fukase et al. | 156/3 |
| 4,095,133 | 6/1978 | Hoeberechts | 313/336 |
| 4,256,532 | 3/1981 | Magdo et al. | 156/628 |
| 4,277,883 | 7/1981 | Kaplan | 29/571 |
| 4,307,507 | 12/1981 | Gray et al. | 29/580 |
| 4,337,115 | 1/1982 | Ikeda et al. | 156/659 |
| 4,498,952 | 2/1985 | Christensen | 156/643 |
| 4,513,308 | 4/1985 | Greene et al. | 357/55 |
| 4,578,614 | 3/1986 | Gray et al. | 313/309 |
| 4,614,564 | 9/1986 | Sheldon et al. | 156/657 |
| 4,670,090 | 6/1987 | Sheng et al. | 156/653 |
| 4,683,024 | 7/1987 | Miller et al. | 156/643 |
| 4,685,996 | 8/1987 | Busta et al. | 156/628 |
| 4,724,328 | 2/1988 | Lischke | 250/492.2 |
| 4,818,914 | 4/1989 | Brodie | 315/169.3 |
| 4,824,795 | 4/1989 | Blanchard | 437/62 |
| 4,853,545 | 8/1989 | Rose | 250/396 |
| 5,007,873 | 4/1991 | Goronkin et al. | 445/49 |

FOREIGN PATENT DOCUMENTS 58-94741 6/1983 Japan .

OTHER PUBLICATIONS

Warren, Vacuum Microelectronics 89, Inst. Phys. Conf. Ser. No. 99: Section 2 (1989), pp. 37–40.

S. Wolf & R. N. Tauber, *Silicon Processing for the VLSI Era,* 1986, Pattern Registration, pp. 473–476.

S. Wolf & R. N. Tauber, *Silicon Processing for the VLSI Era,* 1986, Chp. 14, "Advanced Lithography", pp. 493–511.

*Primary Examiner*—Olik Chaudhuri
*Assistant Examiner*—Loc Q. Trinh
*Attorney, Agent, or Firm*—Bell, Seltzer, Park & Gibson

[57] ABSTRACT

A method of fabricating electron field emitters is disclosed. In this method, a semiconductor substrate is provided with at least one set of alternating conductor and insulator layers formed thereon. An etch is then performed through the at least one set of alternating conductor and insulator layers to form an aperture. An etch resistant layer is formed on the area exposed from the previous etch at the base of the aperture. An etch is performed forming the electron emitter in the one face aligned to the exposed area. The emitter is thereby self-aligned to the overlying conductor and insulator layers. The conductor and insulator layers need not be aligned to an underlying emitter.

25 Claims, 2 Drawing Sheets

SELF-ALIGNED ELECTRON EMITTER FABRICATION METHOD AND DEVICES FORMED THEREBY

FIELD OF THE INVENTION

This invention relates to semiconductor devices and their manufacture and, more specifically, to methods of fabricating electron emitters and the devices formed thereby.

BACKGROUND OF THE INVENTION

Electron emitters are well known in the microelectronics art, and are often referred to as "field emitters". Field emitters are widely used in electron beam lithography tools, scanning tunnel microscopes, electron guns, field ionizers and field emitter vacuum integrated circuits.

Typically, these devices are microelectronic structures with small protruding points. Quantum mechanical tunnelling causes the points to emit an electron beam upon application of an appropriate voltage thereto. The width of the emitted electron beam is determined by the electric field at the tip of the point.

Field emitters have heretofore been formed on a semiconductor substrate by forming conical points on the substrate and then forming one or more conductor layers on the substrate, surrounding, but not covering, the point. The conductor layers are used to form electron extractors, focusing lenses, beam accelerators and other beam shaping electrodes. Typically, many alternating conductor and insulator layers must be formed on the substrate to provide the necessary functions.

A major problem in fabricating field emitters is alignment of the conductor layers to the emitter point. Accurate alignment of these microelectronic layers is necessary for accurate beam extraction and shaping. In particular, the conductor layers must symmetrically surround the emitter point. Stated another way, the emitter point must be centered in the conductor and insulator layers. It is difficult to align each succeeding layer to the underlying field emitter due to alignment tolerances which are typical in semiconductor manufacturing processes. Moreover, the need for many alternating conductor and insulator layers increases the overall alignment errors.

The art has attempted to reduce alignment problems in the individual layers by forming conductor and insulator layers on a substrate having an emitter point formed thereon, and then etching the layers over the point to expose the point. U.S. Pat. No. 4,095,133 to Hoeberechts describes such a field emitter fabrication method. Hoeberechts first forms the conical point on the semiconductor substrate. Then the conductor and insulator layers are formed over the substrate including the point. The conductor and insulator layers over the point are etched away to expose the point. Unfortunately, it is difficult to accurately etch the overlying conductor and insulator layers to symmetrically expose the underlying field emitter. Alignment is difficult, among other reasons, because the underlying field emitter cannot be seen through the conductor and insulator layers, so that it cannot be used as a guide for the etch.

U.S. Pat. No. 4,307,507 to Gray et al. also discloses a method of fabricating field emitter devices wherein the insulator and conductor layers are formed after the emitter point is formed. As above, accurate alignment of the etch to symmetrically expose the underlying field emitter is required.

U.S Pat. No. 4,498,952 to Christensen discloses a field emitter requiring alignment. Here, however, the emitter point is deposited in the aperture formed by etching the insulator and conductor layers. It is difficult to symmetrically deposit the emitter in the aperture. Accordingly, misalignment is produced.

In conclusion, known field emitter fabrication processes require precise alignment of overlying conductor and insulator layers to an underlying emitter point or alignment of an underlying emitter point to overlying conductor and insulator layers. Due to inevitable alignment tolerances, device performance is reduced.

SUMMARY OF THE INVENTION

It is therefore an object of the present invention to provide an improved method of fabricating a field emitter.

It is also an object of the present invention to provide a method of fabricating a field emitter in which the emitter point and overlying conductor and insulator layers are inherently aligned to one another.

These and other objects of the present invention are accomplished by a method of fabricating electron field emitters whereby a semiconductor substrate is provided, and at least one set of alternating conductor and insulator layers are formed on one face of the substrate. An etch then is performed through the at least one set of alternating conductor and insulator layers to thereby form an aperture and expose an area of the one face at the base of the aperture. Next, an etch resistant layer is formed on at least some of the substrate area at the base of the aperture exposed from the previous etch. The substrate is then etched around the etch resistant area to form an electron emitter in the one face, aligned to the exposed area. The aperture may be circular so that a conical emitter point is formed. Alternatively, the aperture may be elongated so a knife-edge shaped emitter is formed.

According to the invention, the alternating conductor and insulator layers are first etched to form an aperture. Then, the emitter is formed by etching the exposed area of the substrate, through the aperture. The emitter is thereby inherently aligned or self-aligned to the overlying conductor and insulator layers. The conductor and insulator layers need not be aligned to an underlying emitter, and an emitter need not be aligned to an aperture in conductor and insulator layers.

The emitter point may be formed in the aperture in at least three ways. First, an etch resistant layer may be formed on all the exposed substrate area at the base of the aperture, and a separate etch may be performed on at least one layer of the alternating conductor and insulator layers, surrounding the etch resistant layer, to expose a region of the substrate surrounding the etch resistant layer. The newly exposed region is then etched to form the emitter point. The etch resistant layer may be formed by etching the layer lying directly on the substrate's one face, with an etchant which is chosen to etch through the layer and then to react with the substrate to form a layer resistant to subsequent etches.

Alternatively, the etch resistant layer may be formed on only some of the exposed area of the substrate at the base of the aperture. An etch resistant layer may be deposited across the entire exposed area. This layer is formed so as to be thicker in the center than at the perimeter. An etch is performed on the layer so as to remove the thin part of the layer at the perimeter, thereby exposing some of the semiconductor surface.

The etch resistant layer may also be directly formed on the exposed area to cover only a portion of the exposed semiconductor surface. The etch to form the emitter point is then performed on the exposed area between the etch resistant layer and the set of alternating conductor and insulator layers at the edge of the opening.

The method of the present invention can be employed to form highly accurate field emitter structures due to the self-aligned nature of the method. A highly accurate semiconductor vacuum triode may be formed by evacuating and capping the aperture. An integrated circuit light source may also be formed by forming a layer of electron excited light emitting material over the aperture.

DETAILED DESCRIPTION OF THE INVENTION

The present invention will be described more fully hereinafter with reference to the accompanying drawings, in which a preferred embodiment of the invention is shown. This invention may, however, be embodied in many different forms and should not be construed as limited to the embodiment set forth herein; rather, Applicant provides this embodiment so that this disclosure will be thorough and complete, and will fully convey the scope of the invention to those skilled in the art.

Like characters refer to like elements throughout. For great clarity, the size of the elements has been exaggerated.

Figures 1, 2, 3, 4A, 4B, 4C, 5A, 5B, 6:
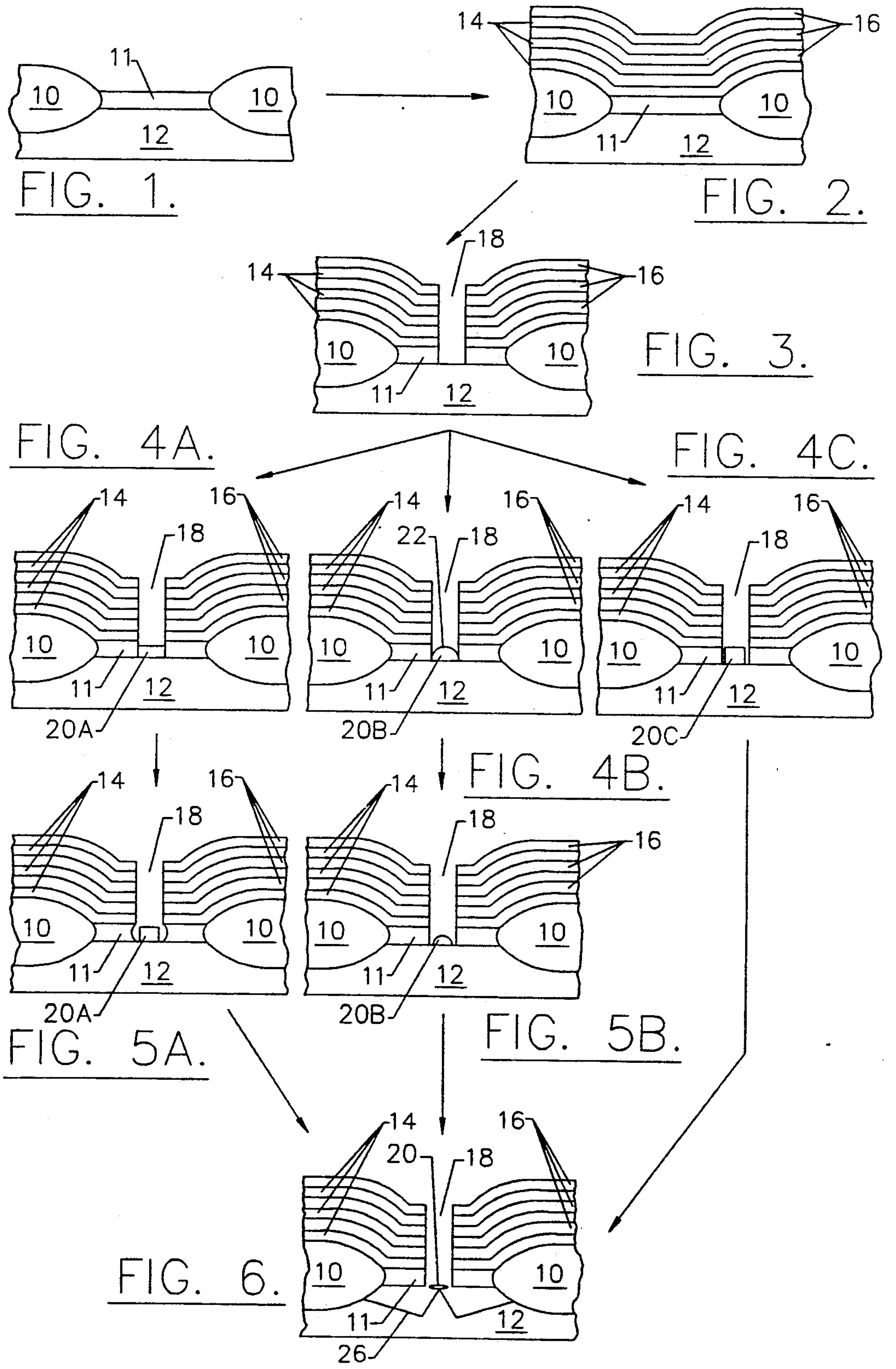
FIG. 1 illustrates a semiconductor substrate upon which the method of the present invention may be practiced.
FIG. 2 illustrates the formation of sets of alternating conductor and insulator layers on the substrate of FIG. 1.
FIG. 3 illustrates the formation of an aperture in the alternating conductor and insulator layers of FIG. 2.
FIGS. 4A, 4B, and 4C illustrate three alternatives for forming an etch resistant layer at the base of the aperture of FIG. 3.
FIGS. 5A and 5B illustrate further steps in forming the etch resistant layer of FIGS. 4A and 4B respectively.
FIG. 6 illustrates the formation of an emitter point using the etch resistant layer of FIGS. 5A, 5B, or 4C.

Referring now to FIG. 1, a semiconductor substrate 12 is shown. If the field emitter device to be formed on substrate 12 is to be isolated from other devices, dielectric isolation regions 10 may also be formed on the substrate between the devices. Isolation regions 10 may be formed by oxidizing the semiconductor substrate 12 and then etching away of some of the formed oxide to expose the semiconductor substrate 12. Alternatively, a masked oxide growth may be performed. It will be understood by those having skill in the art that in order to form a field emitter point in substrate 12, as described in connection with FIG. 6 below, it may be preferable to arrange substrate 12 so that the silicon top face thereof has 100 crystal orientation.

Referring now to FIG. 2, at least one set of alternating insulator and conductor layers 14 and 16 are formed on the semiconductor substrate 12. The conductor and insulator layers are used to form electron extractors, lenses, accelerators and other beam shaping electrodes. Typically, many alternating conducting and insulating layers are formed on the semiconductor substrate 12 to provide these functions. The alternating conductor and insulator layers may be formed by evaporation, sputtering, or chemical vapor deposition for example. Typically, the conductor layers are formed of titanium silicide, molybdenum, or doped polysilicon for example. The conductor layers are typically 0.25 μm thick. The insulator layers are typically formed of silicon dioxide, silicon nitride, or polyimide. The insulator layers are usually 1.0–5.0 μm in thickness.

Alternatively, as shown in FIG. 1, the semiconductor substrate 12 may be thermally oxidized before formation of the alternating conductor and insulator layers 14 and 16 thereby producing an oxide layer 11 between the substrate and the alternating conductor and insulator layers. This oxide is typically thinner than the upper level insulators. Oxide layer 11 functions as the first insulator layer in the device. Typically, the oxide layer in this example is 200 Å thick.

Next, an aperture 18 is etched through the at least one set of alternating conductor and insulator layers 14 and 16, as seen in FIG. 3. This etch may be a reactive ion etch through a resist formed on the alternating conductor and insulator layers. If an oxide layer 11 is present on the substrate 12, that layer is also etched. Such an etch may be performed by an excited directional reactive gas such as carbon hydrofluoride and oxygen ($CHF_3+0_2$).

Next, referring to FIGS. 4A, 4B and 4C, an etch resistant layer 20A, 20B and 20C is formed at the base of the aperture 18. The etch resistant layer must resist the etchant subsequently used to form the emitter point. The emitter point etch is typically a short buffered oxide etch (BOE) with a subsequent anisotropic silicon etch. Silicon dioxide, silicon nitride, and fluorocarbon polymers are suitable materials resistant to these etches.

The etch resistant layer can be formed in at least three ways. First as seen in FIG. **4*a*, an etch resistant layer 20A is formed at the base of the aperture covering all of the exposed area of the base. One way to accomplish this is to use a polymer-producing etch when etching the oxide layer 11. $CHF_3$ or $C_2F_6$ are examples of appropriate polymer-producing etchant. Then, as seen in FIG. 5A, insulator layer 14 adjacent to the substrate 12 is etched away from the etch resistant layer 20A in order to expose at least some area of the substrate 12 for the upcoming emitter point etch. If a conductor layer is the first layer on the substrate 12**, an etchant for the conductor material is used.

Alternatively, as seen in FIG. 4B, an etch resistant layer 20B is formed at the base of the aperture 18. This etch resistant layer 20B is formed so as to be thicker at the center or inside portion of the base 22 than at the perimeter or outside portion 24 of the base. Next, as seen in FIG. 5B, the etch resistant layer 20B is subjected to an etch which removes all of the etch resistant layer 20B at the perimeter 24 of the base but removes only some or none at the center 22 of the base. Consequently, portions of the substrate 12 are exposed at the base of the aperture 18. Ionized $CHF_3+O_2$ is an appropriate etchant with silicon nitride as an etch resistant material.

The surface of the silicon may be converted to an etch resistant layer by a heavy dose ion mixing of the surface with a dopant such as boron or oxygen. The surface may also be chemically converted. For example, a conversion of the surface to a silicon nitride type compound using $NH_3$ in a plasma or reactive ion generator may be performed. In either case, the lowest one of the alternating conductor and insulator layer may be undercut using an isotropic etch (For example, dilute HF may be used if the lowest film is $SiO_2$) to provide an opening for the crystallographic etch as seen in FIG. 5A.

Finally, the etch resistant layer 20C may be formed by depositing the etch resistant layer so that portions of the perimeter 24 of the base are exposed. This may be accomplished by highly directional evaporation.

Figure 7:
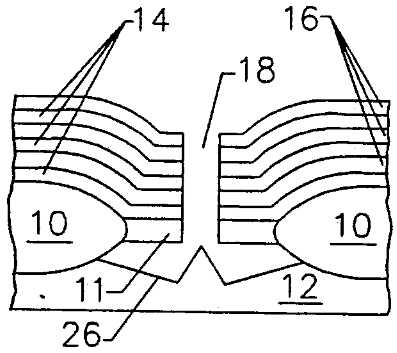
FIG. 7 illustrates the removal of the etch resistant layer of FIG. 6.

After the etch resistant layer is formed, an etch is performed on the semiconductor substrate 12 which etches the semiconductor substrate surface but, effectively, not the etch resistant layer, thereby forming a point or knife-shaped emitter structure 26 as shown in FIG. 6. A point-shaped (pyramid or conical) emitter is formed by using a square or circular-shaped aperture and a knife-shaped emitter is formed using an elongated aperture. Referring to FIG. 7, the residue of etch resistant layer 20 is then removed, by chemical means, i.e., phosphoric acid and water at 180° C. if the layer is a silicon nitride-type compound. If an etch resistant layer is employed being thicker in the center than at the perimeter (FIG. 4B), a reactive ion etch may be used that etches the substrate 12 faster than the etch resistant layer to form the emitter structure.

Typically, in the case of a silicon substrate, the cathode tip will be oxidized at this step to shape the tip to a fine point. This may be done with the etch resistant layer in place if the etch resistant layer is compatible with the materials used. Multiple oxidations and $SiO_2$ strips making use of the selectivity enhanced oxidation in the now exposed plane will effectively sharpen the point (i.e., oxidation in oxygen at 750° C.). Electrolytic sharpening may also be used with some substrate materials. Care should be taken to avoid damaging the upper electrodes during these steps. An 80% $H_2$+20% $O_2$ mixture of gas during tip sharpening at 800° C., for example, can eliminate oxidation of a tungsten electrode during a silicon tip sharpening process.

Figure 8:
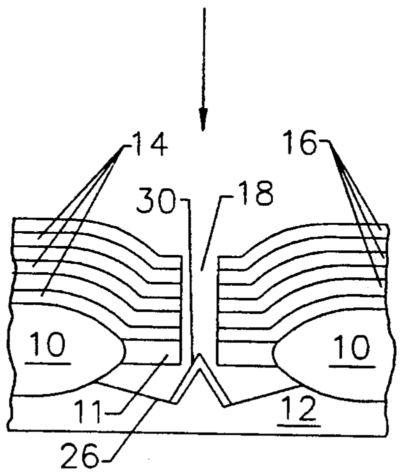
FIG. 8 shows the cladding of the emitter point formed in FIG. 7.

Optionally, as seen in FIG. 8, the point structure 26 may be clad 30 with tungsten or nickel. Typically, this is performed by chemical vapor deposition or electron plating. The cladding of the emitter provides a lower work function for improved emission. Additionally, point sharpening methods such as oxidation of the point or knife edge and oxide removal may be performed as desired.

Figure 9:
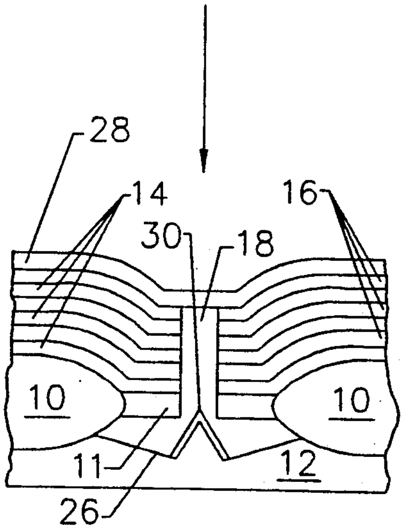
FIG. 9 illustrates the capping of the structure of FIGS. 7 or 8 to form a vacuum triode or integrated circuit light source.

Referring to FIG. 9, a vacuum triode may be formed by the method of the present invention. Such a structure is formed by capping the device of FIGS. 7 or 8 with a conductor. The cap 28 may be formed by a shallow angle deposition, evaporation, or by other processes. A light source may also be formed by capping a layer of electron excited light emitting material 28 on the at least one set of alternating conductor and insulator layers 14 and 16. This material may include tin-doped indium oxide or layered phosphorous with thin transparent conductors. In the case of a layered phosphorous, layers of the electron excited light emitting material may be deposited between the layers' transparent conductors to obtain color outputs.

In operation, the emitter formed according to the present invention emits electrons through the aperture 18. The conductor and insulator layers 14 and 16 operate to focus and deflect the stream of electrons. When the electrons contact layer 28, the layer 28 responds to the stimulus by emitting light.

In summary, a method of fabricating a field emitter is disclosed. The emitter of the device formed by this method is highly accurate due to the self-aligned nature of the method. This method allows for a greatly simplified manufacture of high efficiency, precision field emitters.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A self-aligned method of forming a field emitter comprising the steps of:

providing a semiconductor substrate having at least one set of alternating conductor and insulator layers on one face thereof, and an aperture extending through said at least one set of conductor and insulator layers to expose an area of said one face at the base of said aperture; then forming an etch resistant layer on at least part of the exposed area of said one face at the base of said aperture extending through said at least one set of conductor and insulator layers; and then etching said exposed area of said one face, having said etch resistant layer thereon at the base of said aperture, to thereby form an electron emitter in said semiconductor substrate at the base of said aperture at said one face.

2. The method of claim 1 wherein said etch resistant layer forming step comprises the step of forming an etch resistant layer on all of the exposed area; and wherein said etching said exposed area step is preceded by the step of etching at least one layer in said at least one set of conductor and insulator layers, surrounding said etch resistant layer, to thereby expose a region of said one face surrounding said etch resistant layer.

3. The method of claim 2 wherein said step of forming at least one set of alternating conductor and insulator layers comprises the step of forming at least one set of alternating conductor and insulator layers, with an insulator layer being formed immediately upon said one face; and wherein said step of etching at least one layer comprises the step of etching the one insulator layer formed immediately upon said one face.

4. The method of claim 1 wherein said etch resistant layer forming step comprises the step of etching the layer in at least one set of conductor and insulator layers which lies directly upon said one face, with an etchant which reacts with said substrate to form said etch resistant layer.

5. The method of claim 4 wherein said etch resistant layer forming step comprises the step of forming an etch resistant layer on all of the exposed area; and wherein said etching said exposed area step is preceded by the step of etching at least one layer in said at least one set of conductor and insulator layers, surrounding said etch resistant layer, to thereby expose a region of said one face surrounding said etch resistant layer.

6. The method of claim 5 wherein said step of forming at least one set of alternating conductor and insulator layers comprises the step of forming at least one set of alternating conductor and insulator layers, with an insulator layer being formed immediately upon said face; and wherein said step of etching at least one layer comprises the step of etching said one insulator layer formed immediately upon said one face.

7. The method of claim 1 wherein said etch resistant layer forming step comprises the steps of:

forming an etch resistant layer on all of the exposed area, the center of said etch resistant layer being thicker than the perimeter thereof; and etching the etch resistant layer to remove the perimeter while allowing at least some of the center to remain.

8. The method of claim 1 wherein said etch resistant layer forming step comprises the step of:

forming an etch resistant layer only in the center of said exposed area.

9. The method of claim 1 wherein said etching said exposed area step is followed by the step of capping said at least one set of alternating conductor and insulator layers over the exposed area off said one face to thereby form an integrated circuit vacuum triode.

10. The method of claim 9 wherein said capping step comprises the step of capping said at least one set of alternating conductor and insulator layers with an electron excited light emitter material to thereby form an integrated circuit light source.

11. A self-aligned method of forming a field emitter comprising the steps of:

providing a semiconductor substrate; then forming at least one set of alternating conductor and insulator layers on one face of said semiconductor substrate; then etching through said at least one set of conductor and insulator layers to form an aperture therein and expose an area of said one face at the base of said aperture; then forming an etch resistant layer on at least part of the exposed area of said one face at the base of said aperture, through said aperture in said at least one set of conductor and insulator layers; and then etching said exposed area of said one face, having said etch resistant layer thereon at the base of said aperture, to thereby form an electron emitter in said semiconductor substrate at the base of said aperture at said one face.

12. The method of claim 11 wherein said etch resistant layer forming step comprises the step of forming an etch resistant layer on all of the exposed area; and wherein said etching said exposed area step is preceded by the step of etching at least one layer in said at least one set of conductor and insulator layers, surrounding said etch resistant layer, to thereby expose a region of said one face surrounding said etch resistant layer.

13. The method of claim 12 wherein said step of forming at least one set of alternating conductor and insulator layers comprises the step of forming at least one set cf alternating conductor and insulator layers, with an insulator layer being formed immediately upon said one face; and wherein said step of etching at least one layer comprises the step of etching the one insulator layer formed immediately upon said one face.

14. The method of claim 11 wherein said etch resistant layer forming step comprises the step of etching the layer in at least one set of conductor and insulator layers which lies directly upon said one face, with an etchant which reacts with said substrate to form said etch resistant layer.

15. The method of claim 14 wherein said etch resistant layer forming step comprises the step of forming an etch resistant layer on all of the exposed area; and wherein said etching said exposed area step is preceded by the step of etching at least one layer in said at least one set of conductor and insulator layers, surrounding said etch resistant layer, to thereby expose a region of said one face surrounding said etch resistant layer.

16. The method of claim 5 wherein said step of forming at least one set of alternating conductor and insulator layers comprises the step of forming at least one set of alternating conductor and insulator layers, with an insulator layer being formed immediately upon said face; and wherein said step of etching at least one layer comprises the step of etching said one insulator layer formed immediately upon said one face.

17. The method of claim 11 wherein said etch resistant layer forming step comprises the steps of:

forming an etch resistant layer on all of the exposed area, the center of said etch resistant layer being thicker than the perimeter thereof; and etching the etch resistant layer to remove the perimeter while allowing at least some of the center to remain.

18. The method of claim 11 wherein said etch resistant layer forming step comprises the step of:

forming an etch resistant layer only in the center of said exposed area.

19. The method of claim 11 wherein said providing a semiconductor substrate step further comprises the step of:

forming a dielectric isolation region on said one face, said dielectric isolation region surrounding said one face where said electron emitter is desired.

20. The method of claim 11 wherein the step of forming at least one set of alternating conductors and insulator layers is preceded by the step of:

oxidizing said semiconductor substrate to form a thin oxide layer thereon.

21. The method of claim 11 wherein said etching said exposed area step is followed by the step of:

cladding said electron emitter.

22. The method of claim 11 wherein said etching through said at least one set step comprises the step of:

etching through said at least one set of conductor and insulator layers to expose a circular area of said one face.

23. The method of claim 11 wherein said etching through said at least one set step comprises the step of:

etching through said at least one set of conductor and insulator layers to expose an elongated area of said one face.

24. The method of claim 11 wherein said etching said exposed area step is followed by the step of capping said at least one set of alternating conductor and insulator layers over the exposed area of said one face to thereby form an integrated circuit vacuum triode.

25. The method of claim 24 wherein said capping step comprises the step of capping said at least one set of alternating conductor and insulator layers with an electron excited light emitting material to thereby form an integrated circuit light source.

* * * * *

UNITED STATES PATENT AND TRADEMARK OFFICE

CERTIFICATE OF CORRECTION

PATENT NO. : 5,126,287

DATED : June 30, 1992

INVENTOR(S) : Jones

It is certified that error appears in the above-identified patent and that said Letters Patent is hereby corrected as shown below:

In the ABSTRACT:

Line 9, "the" should be --an--.

Column 4, line 16, "0.25 μm" should be --0.25μm--.

Column 7, line 61, "cf" should be --of--.

Column 8, line 13, "5" should be --15--.

Signed and Sealed this

Second Day of November, 1993

Attest:

Bruce Lehman

BRUCE LEHMAN

*Attesting Officer* *Commissioner of Patents and Trademarks*